(12) United States Patent
Dorgan et al.

(10) Patent No.: US 11,264,317 B2
(45) Date of Patent: Mar. 1, 2022

(54) ANTIFUSE MEMORY ARRAYS WITH ANTIFUSE ELEMENTS AT THE BACK-END-OF-LINE (BEOL)

(71) Applicant: Intel Corporation, Santa Clara, CA (US)

(72) Inventors: Vincent Dorgan, Hillsboro, OR (US); Jeffrey Hicks, Banks, OR (US); Miriam Reshotko, Portland, OR (US); Abhishek Sharma, Hillsboro, OR (US); Ilan Tsameret, Portland, OR (US)

(73) Assignee: Intel Corporation, Santa Clara, CA (US)

(*) Notice: Subject to any disclaimer, the term of this patent is extended or adjusted under 35 U.S.C. 154(b) by 820 days.

(21) Appl. No.: 15/942,999

(22) Filed: Apr. 2, 2018

(65) Prior Publication Data

US 2019/0304894 A1 Oct. 3, 2019

(51) Int. Cl.

| | |
|---|---|
| *H01L 23/50* | (2006.01) |
| *H01L 23/48* | (2006.01) |
| *H01L 29/51* | (2006.01) |
| *G11C 17/16* | (2006.01) |
| *H01L 21/82* | (2006.01) |
| *H01L 23/522* | (2006.01) |

(Continued)

(52) U.S. Cl.
CPC ............ *H01L 23/50* (2013.01); *G11C 17/165* (2013.01); *H01L 21/82* (2013.01); *H01L 23/481* (2013.01); *H01L 23/49866* (2013.01); *H01L 23/5228* (2013.01); *H01L 23/5252* (2013.01); *H01L 29/51* (2013.01)

(58) Field of Classification Search
CPC ....... H01L 23/50; H01L 23/481; H01L 29/51; H01L 21/82; H01L 23/5228; H01L 23/5252; H01L 23/49866; H01L 27/11206; G11C 17/165; G11C 17/16; G11C 17/18

See application file for complete search history.

(56) References Cited

U.S. PATENT DOCUMENTS

| | | | |
|---|---|---|---|
| 2009/0294903 A1* | 12/2009 | Shih | H01L 27/0733 257/530 |
| 2016/0336332 A1* | 11/2016 | Lee | H01L 27/11206 |
| 2018/0097177 A1* | 4/2018 | Chang | H01L 45/12 |

\* cited by examiner

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

Embodiments herein may describe techniques for an integrated circuit including a metal interconnect above a substrate, an interlayer dielectric (ILD) layer above the metal interconnect with an opening to expose the metal interconnect at a bottom of the opening. A dielectric layer may conformally cover sidewalls and the bottom of the opening and in contact with the metal interconnect. An electrode may be formed within the opening, above the metal interconnect, and separated from the metal interconnect by the dielectric layer. After a programming voltage may be applied between the metal interconnect and the electrode to generate a current between the metal interconnect and the electrode, a conductive path may be formed through the dielectric layer to couple the metal interconnect and the electrode, changing the resistance between the metal interconnect and the electrode. Other embodiments may be described and/or claimed.

26 Claims, 7 Drawing Sheets

(51) Int. Cl.
*H01L 23/525* (2006.01)
*H01L 23/498* (2006.01)

ANTIFUSE MEMORY ARRAYS WITH ANTIFUSE ELEMENTS AT THE BACK-END-OF-LINE (BEOL)

FIELD

Embodiments of the present disclosure generally relate to the field of integrated circuits, and more particularly, to antifuse elements and memory arrays.

BACKGROUND

An integrated circuit (IC) may include many components, e.g., transistors, resistors, capacitors, diodes, formed on a semiconductor substrate. In addition, ICs may often include one or more types of memory arrays formed by multiple memory cells, such as a CMOS memory array including multiple memory cells, an antifuse memory array including multiple antifuse elements, or a fuse memory array including multiple fuse elements. In electronics and electrical engineering, a fuse element may be an electrical safety device that operates to provide overcurrent protection of an electrical circuit. Normally, a fuse element may include a copper wire, strip, or interconnect, which may melt or break down when too much current flows through it, thereby interrupting the current. A fuse element with a copper wire may melt at a high current, and may create a void space in the fuse element after the copper wire has been melted, which may post security risks. In addition, a fuse memory array including multiple fuse elements with copper wire may occupy a large area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1C:
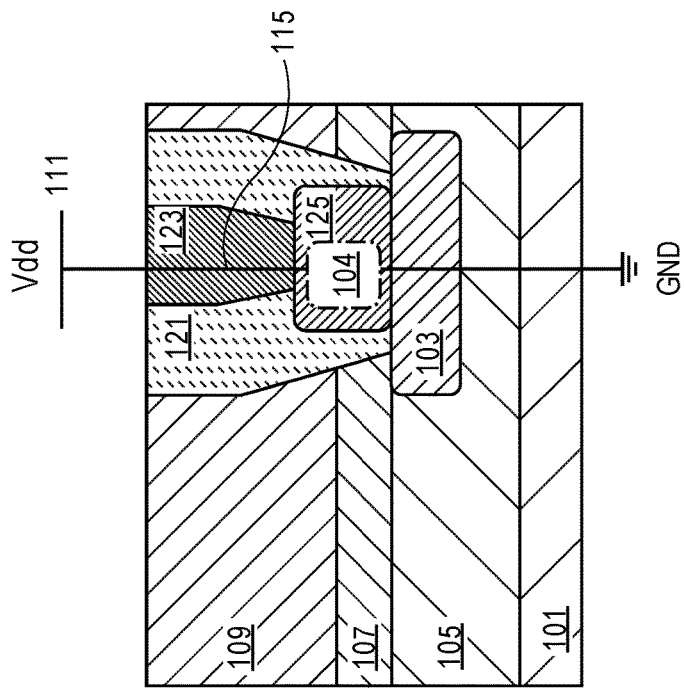
FIGS. 1(a)-1(c) schematically illustrate diagrams of an antifuse element including a dielectric layer between an electrode and a metal interconnect, where a conductive path may be formed through the dielectric layer, in accordance with some embodiments.

A fuse element may be an electrical safety device that operates to provide overcurrent protection of an electrical circuit. Conventionally, a fuse element may include a copper interconnect. A copper interconnect of a fuse element may melt at a high current, e.g., around 10 milliamps (mA) to 30 mA, when a high voltage, e.g., 5 voltage, is applied to the fuse element. After the copper interconnect of the fuse element has been melted, the fuse element may include a void space that was occupied by the copper interconnect before it has been melted. Such a void space may be detectable by top-down imaging techniques, hence making the fuse element vulnerable for security reasons. In addition, a fuse memory array including multiple fuse elements having copper interconnects may occupy a large area.

An antifuse element may be an electrical device that performs the opposite operations to a fuse element. Whereas a fuse element starts with a low resistance and may permanently break an electrically conductive path (typically when the current through the path exceeds a specified limit), an antifuse element starts with a high resistance and may permanently create an electrically conductive path (typically when the voltage across the antifuse element exceeds a certain level).

Embodiments herein may include an antifuse element including a dielectric layer between an electrode and a metal interconnect. The metal interconnect, the dielectric layer, and the electrode may form a metal-insulator-metal antifuse element with a first resistance. When a programming voltage may be applied between the metal interconnect and the electrode to generate a current between the metal interconnect and the electrode, a conductive path within the dielectric layer may be formed between the metal interconnect and the electrode. A second resistance may exist between the metal interconnect and the electrode coupled by the conductive path through the dielectric layer. The first resistance may be about $10^3$ to $10^7$ times larger than the second resistance. In some embodiments, the program voltage may be a low voltage in a range of about 1.2 v to 4 v.

Embodiments herein may present an integrated circuit (IC) including a metal interconnect above a substrate. An interlayer dielectric (ILD) layer may be above the metal interconnect, and include an opening to expose the metal interconnect at a bottom of the opening. A dielectric layer may conformally cover sidewalls and the bottom of the opening and in contact with the metal interconnect. An electrode may be formed within the opening, above the metal interconnect, and separated from the metal interconnect by the dielectric layer. A first resistance may exist between the metal interconnect and the electrode through the dielectric layer. After a programming voltage may be applied between the metal interconnect and the electrode to generate a current between the metal interconnect and the electrode, a conductive path may be formed through the dielectric layer to couple the metal interconnect and the electrode. A second resistance may exist between the metal interconnect, the conductive path through the dielectric layer, and the electrode.

Embodiments herein may present a method for forming an IC. The method may include: forming a metal interconnect above a substrate; forming an ILD layer above the metal interconnect; and forming an opening of the ILD layer to expose the metal interconnect at a bottom of the opening. The method may further include: forming a dielectric layer conformally covering sidewalls and the bottom of the opening, and in contact with the metal interconnect; and forming an electrode within the opening, next to the dielectric layer, above the metal interconnect, and separated from the metal interconnect by the dielectric layer. A first resistance may exist between the metal interconnect and the electrode through the dielectric layer. After a programming voltage may be applied between the metal interconnect and the electrode to generate a current between the metal interconnect and the electrode, a conductive path may be formed through the dielectric layer to couple the metal interconnect and the electrode. A second resistance may exist between the metal interconnect, the conductive path through the dielectric layer, and the electrode.

Embodiments herein may present a computing device including a circuit board and an antifuse memory array coupled to the circuit board. The antifuse memory array may include a plurality of antifuse cells. An antifuse cell of the plurality of antifuse cells may include an antifuse element and a selector. An antifuse element may include a metal interconnect above a substrate, where the metal interconnect is coupled to a bit line of the antifuse memory array. An ILD layer may be above the metal interconnect. The ILD layer may include an opening to expose the metal interconnect at a bottom of the opening. A dielectric layer may conformally cover sidewalls and the bottom of the opening and in contact with the metal interconnect. An electrode may be formed within the opening, above the metal interconnect, and separated from the metal interconnect by the dielectric layer. The electrode may be coupled to a first contact of the selector. The selector may include a second contact coupled to a word line of the antifuse memory array. A first resistance may exist between the metal interconnect and the electrode through the dielectric layer. After a programming voltage may be applied between the metal interconnect and the electrode to generate a current between the metal interconnect and the electrode, a conductive path may be formed through the dielectric layer to couple the metal interconnect and the electrode. A second resistance may exist between the metal interconnect, the conductive path through the dielectric layer, and the electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1A:
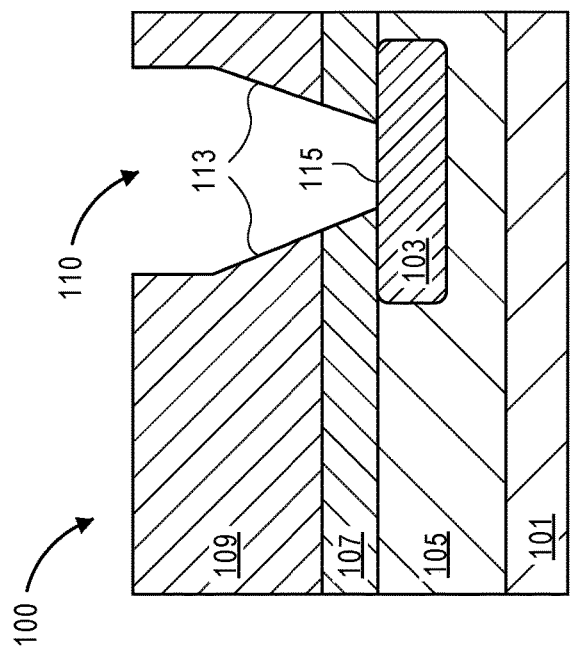
Figure 1B:
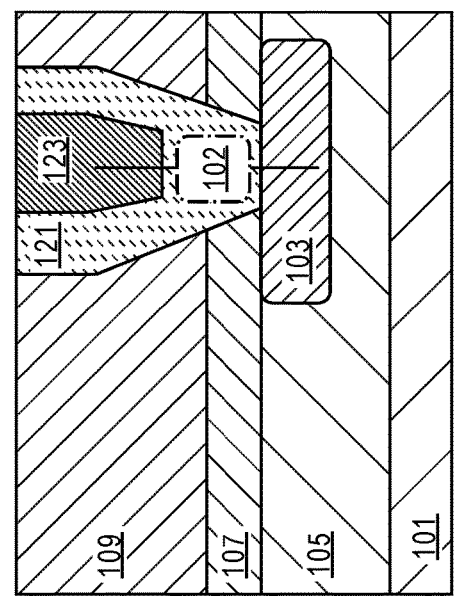

FIGS. 1(a)-1(c) schematically illustrate diagrams of an antifuse element 100 including a dielectric layer 121 between an electrode 123 and a metal interconnect 103, where a conductive path 125 may be formed through the dielectric layer 121, in accordance with some embodiments. For clarity, features of the antifuse element 100, the dielectric layer 121, the electrode 123, the metal interconnect 103, and the conductive path 125 may be described below as examples for understanding an example antifuse element, a dielectric layer, an electrode, a metal interconnect, and a conductive path. It is to be understood that there may be more or fewer components within an antifuse element, a dielectric layer, an electrode, a metal interconnect, and a conductive path. Further, it is to be understood that one or more of the components within an antifuse element, a dielectric layer, an electrode, a metal interconnect, and a conductive path may include additional and/or varying features from the description below, and may include any device that one having ordinary skill in the art would consider and/or refer to as an antifuse element, a dielectric layer, an electrode, a metal interconnect, and a conductive path.

In embodiments, as shown in FIG. 1(a), the antifuse element 100 may include a substrate 101, an interlayer dielectric (ILD) layer 105 above the substrate 101, and an etching stop layer 107 above the ILD layer 105. The metal interconnect 103 may be within the ILD layer 105. An ILD layer 109 may be above the etching stop layer 107 and above the metal interconnect 103. The ILD layer 109 may include an opening 110 to expose the metal interconnect 103 at a bottom 115 of the opening 110. The opening 110 may include sidewalls 113 that are through the etching stop layer 107 and coupled to the bottom 115.

In embodiments, as shown in FIG. 1(b), the dielectric layer 121 may conformally cover sidewall 113 and the bottom 115 of the opening 110 and in contact with the metal interconnect 103. The dielectric layer 121 may have a thickness in a range of about 1.5 nanometer (nm) to 4 nm. The dielectric layer 121 may be formed by atomic layer deposition (ALD) to have more accurate control of the thickness of the dielectric layer 121. The dielectric layer 121 may include silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

The electrode 123 may be within the opening 110, above the metal interconnect 103, and separated from the metal interconnect 103 by the dielectric layer 121. The electrode 123 may be formed by using a mask to deposit photoresist in the opening 110 while etching away dielectric material used to form the dielectric layer 121. Afterwards, the photoresist deposited into the opening 110 may be removed and a metal fill process may proceed to fill the space occupied by the photoresist to form the electrode 123 within the opening 110. As a result, the electrode 123, the dielectric layer 121, and the metal interconnect 103 may form a metal-insulator-metal antifuse element. A first resistance 102 may exist between the metal interconnect 103 and the electrode 123 through the dielectric layer 121. The resistance 102 represented by a symbol may be a symbolic view to show a resistance, not a real physical component.

In embodiments, as shown in FIG. 1(c), after a programming voltage 111 may be applied between the electrode 123 and the metal interconnect 103 to generate a current 115 flowing between the electrode 123 and the metal interconnect 103, the conductive path 125 may be formed through the dielectric layer 121 to couple the metal interconnect 103 and the electrode 123. The conductive path 125 may be a permanent conductive path that exists after the programming voltage 111 is removed. A second resistance 104 may exist between the metal interconnect 103, the conductive path 125 through the dielectric layer 121, and the electrode 123. The programming voltage 111 may be in a range of about 1.2 v to 4 v. The current 115 may be less than or equal to about 10 mA. The first resistance 102 may be about 103 to 107 times larger than the second resistance 104.

In embodiments, the first resistance 102 and the second resistance 104 of the antifuse element 100 may represent a digital 0 and a digital 1, or a digital 1 and a digital 0, respectively. The antifuse element 100 may be programmed to be 0 or 1, without creating a void space within the antifuse element 100. Hence, the antifuse element 100 may be more secure than a fuse element including a copper interconnect, which may leave a void space once the copper interconnect is melted after a programming voltage is applied to the fuse element. The antifuse element 100 may be used to store security keys on-die, and its stored content may not be able to be discovered by imaging inspection of the void spaces contained in the antifuse element 100.

In embodiments, the substrate 101 may be a silicon substrate, a glass substrate, such as soda lime glass or borosilicate glass, a metal substrate, a plastic substrate, a substrate including and SiO2, or another suitable substrate. The ILD layer 105 and the ILD layer 109 may include a silicon oxide (SiO) film, a silicon nitride (SiN) film, O3-tetraethylorthosilicate (TEOS), O3-hexamethyldisiloxane (HMDS), plasma-TEOS oxide layer, or other suitable materials.

In embodiments, the metal interconnect 103 or the electrode 123 may be formed as a single layer or a stacked layer using one or more conductive films including a conductive material. For example, the metal interconnect 103 or the electrode 123 may include titanium (Ti), tungsten (W), molybdenum (Mo), gold (Au), platinum (Pt), ruthenium (Ru), iridium (Ir), aluminum (Al), Cu, tantalum (Ta), nickel (Ni), chromium (Cr), hafnium (Hf), indium (In), or an alloy of Ti, Mo, Au, Pt, Al Ni, Cu, Cr, TiAlN, HfAlN, or InAlO. For example, the metal interconnect 103 or the electrode 123 may include tantalum nitride (TaN), titanium nitride (TiN), iridium-tantalum alloy (Ir-Ta), indium-tin oxide (ITO), the like, and/or a combination thereof.

Figure 2C:
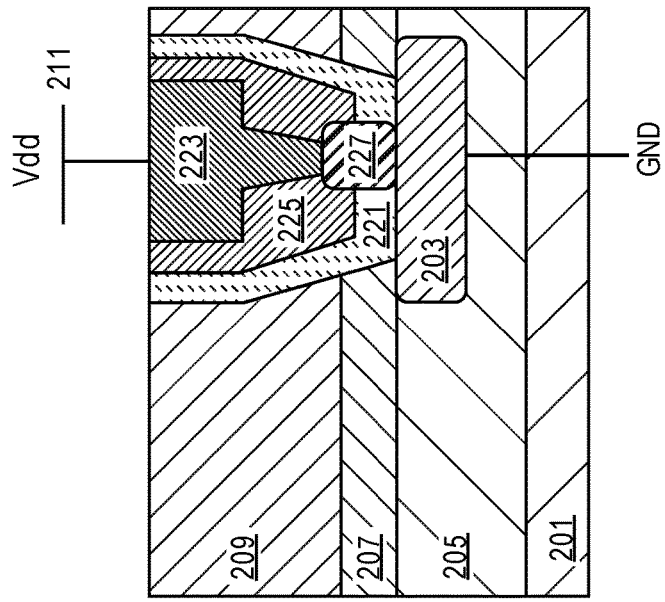
FIGS. 2(a)-2(c) schematically illustrate diagrams of an antifuse element including a dielectric layer and an oxygen exchange layer (OEL) between an electrode and a metal interconnect, where a conductive path may be through the dielectric layer and the OEL, in accordance with some embodiments.
Figure 2A:
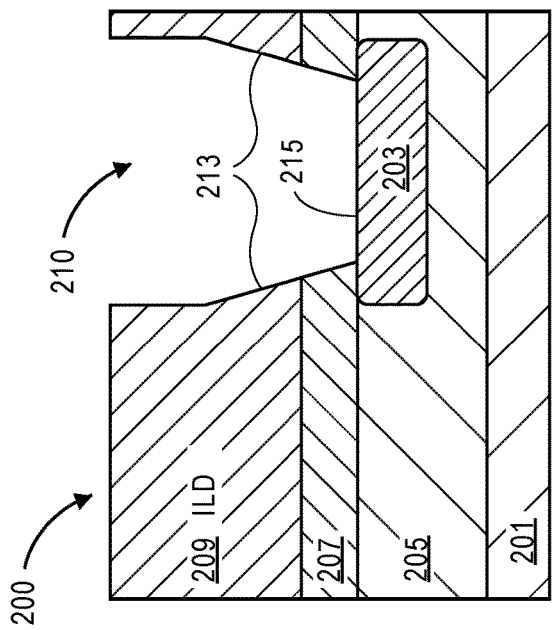
Figure 2B:
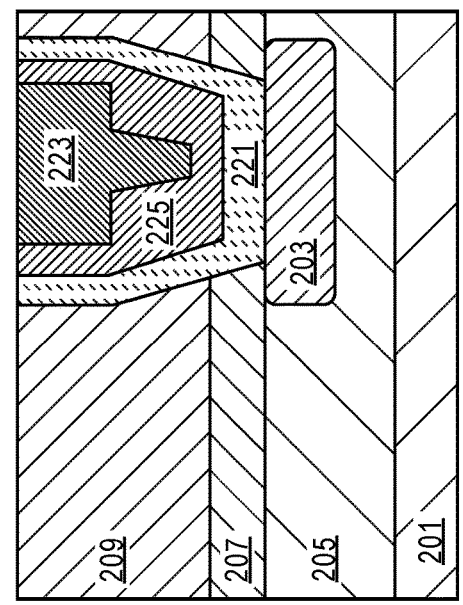

FIGS. 2(a)-2(c) schematically illustrate diagrams of an antifuse element 200 including a dielectric layer 221 and an oxygen exchange layer (OEL) 225 between an electrode 223 and a metal interconnect 203, where a conductive path 227 may be through the dielectric layer 221 and the OEL 225, in accordance with some embodiments. In embodiments, the antifuse element 200, the dielectric layer 221, the electrode 223, the metal interconnect 203, and the conductive path 227 may be similar to the antifuse element 100, the dielectric layer 121, the electrode 123, the metal interconnect 103, and the conductive path 125, respectively.

In embodiments, the antifuse element 200 may include a substrate 201, an ILD layer 205 above the substrate 201, and an etching stop layer 207 above the ILD layer 205. The metal interconnect 203 may be within the ILD layer 205. An ILD layer 209 may be above the etching stop layer 207 and above the metal interconnect 203. The ILD layer 209 may include an opening 210 to expose the metal interconnect 203 at a bottom 215 of the opening 210. The opening 210 may include sidewalls 213 that are through the etching stop layer 207 and coupled to the bottom 215.

In embodiments, the dielectric layer 221 may conformally cover sidewalls 213 and the bottom 215 of the opening 210 and in contact with the metal interconnect 203. The OEL 225 may be next to the dielectric layer 221 and conformally cover the dielectric layer 221 to separate the electrode 223 and the metal interconnect 203. The OEL 225 may include silicon (Si), carbon (C), titanium (Ti), zirconium (Zr), magnesium (Mg), or hafnium (Hf). The OEL 225 may have a thickness less than 5.8 nm.

The electrode 223 may be within the opening 210, above the metal interconnect 203, and separated from the metal interconnect 203 by the dielectric layer 221 and the OEL 225. When a programing voltage 211 is applied to the electrode 223 and the metal interconnect 203, the conductive path 227 may be formed through the dielectric layer 221 and the OEL 225 to couple the metal interconnect 203 and the electrode 223. The OEL 225 may facilitate breakdown of the dielectric layer 221 and formation of the conduction path 227 so that a lower programming voltage may be used in forming the conduction path 227. For example, the dielectric layer 221 may be in a range of about 1.5 nm to 2 nm, the OEL 225 may be in a thickness of about 3 nm to 5 nm, and the programming voltage 211 may be in a range of 1.2 v to 2 v.

Figure 3:
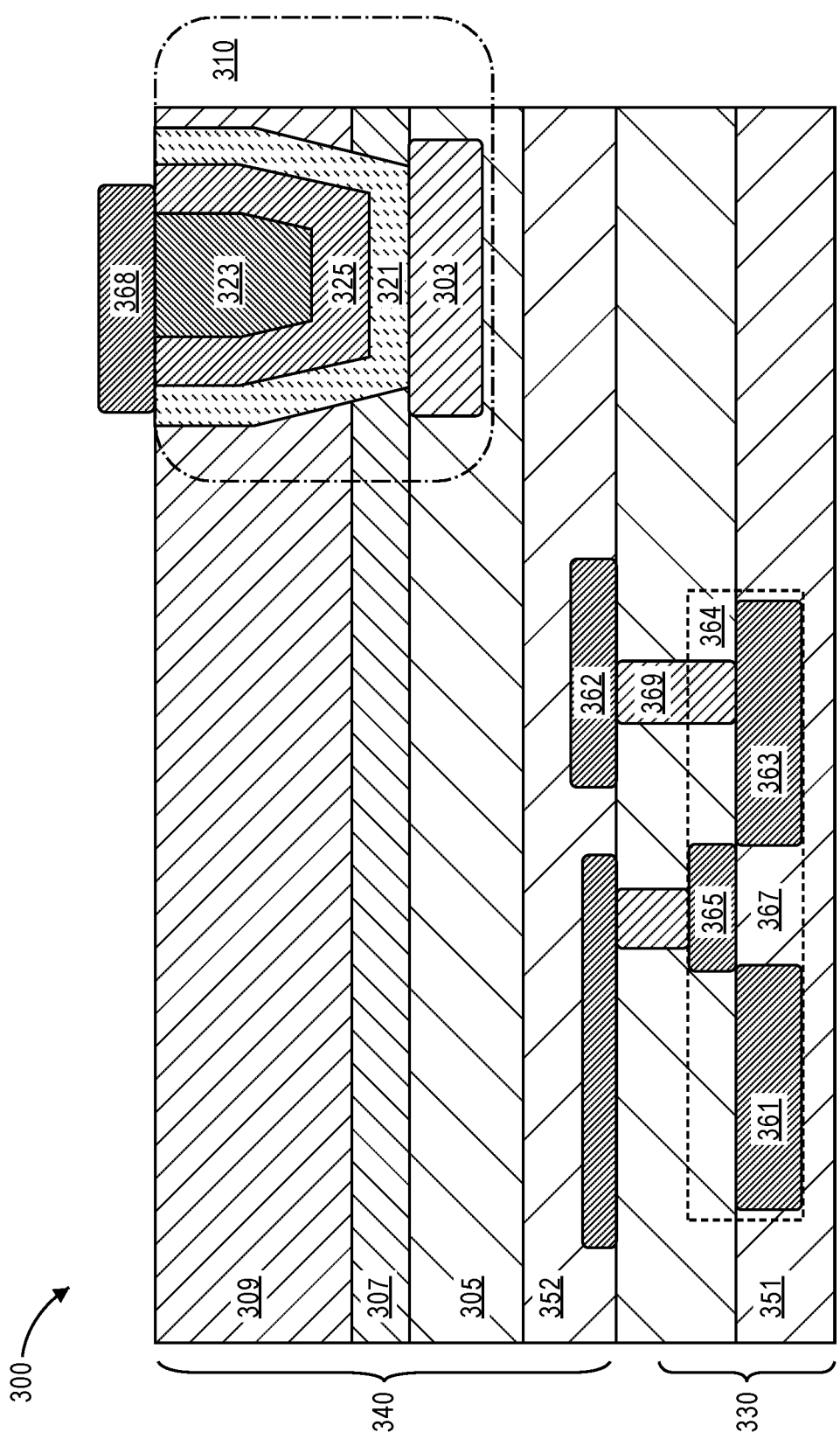
FIG. 3 schematically illustrates a diagram of an integrated circuit (IC) with an antifuse element including a dielectric layer between an electrode and a metal interconnect in back-end-of-line (BEOL) on a substrate, in accordance with some embodiments.

FIG. 3 schematically illustrates a diagram of an IC 300 with an antifuse element 310 including a dielectric layer 321 between an electrode 323 and a metal interconnect 303 in back-end-of-line (BEOL) on a substrate 351, in accordance with some embodiments. In embodiments, the antifuse element 310, the dielectric layer 321, the electrode 323, the metal interconnect 303, and the substrate 351 may be examples of the antifuse element 100, the dielectric layer 121, the electrode 123, the metal interconnect 103, and the substrate 101, respectively, as shown in FIG. 1. Furthermore, the antifuse element 310, the dielectric layer 321, the electrode 323, the metal interconnect 303, and the substrate 351 may be similar to the antifuse element 200, the dielectric layer 221, the electrode 223, the metal interconnect 203, and the substrate 201, respectively, as shown in FIG. 2.

In embodiments, the antifuse element 310 may be formed at BEOL 340. The antifuse element 310 may be above the substrate 351, and may include an ILD layer 305 above the substrate 351, and an etching stop layer 307 above the ILD layer 305. The metal interconnect 303 may be within the ILD layer 305. An ILD layer 309 may be above the etching stop layer 307 and above the metal interconnect 303. The ILD layer 309 may include an opening to expose the metal interconnect 303 at a bottom of the opening. The sidewalls of the opening may be through the etching stop layer 307. The dielectric layer 321 may conformally cover sidewalls and the bottom of the opening of the ILD layer 309 and in contact with the metal interconnect 303. An OEL 325 may be next to the dielectric layer 321 and conformally cover the dielectric layer 321 to separate the electrode 323 and the metal interconnect 303. The electrode 323 may be within the opening, above the metal interconnect 303, and separated from the metal interconnect 303 by the dielectric layer 321 and the OEL 325. The electrode 323 may include a via embedded within the ILD layer 309, and may be further coupled to other interconnect, e.g., an interconnect 368.

In embodiments, the IC 300 may include a FEOL 330. The FEOL 330 may include the substrate 351. In addition, the FEOL 330 may include other devices, e.g., a transistor 364. In embodiments, the transistor 364 may be a FEOL transistor, including a source 361, a drain 363, and a gate electrode 365, with a channel 367 between the source 361 and the drain 363 under the gate electrode 365. Furthermore, the transistor 364 may be coupled to interconnects, e.g., an interconnect 362 within an ILD layer 352 through a via 369. In embodiments, the gate electrode 365 and the metal interconnect 303 may include a same material, but in different metal layers of the IC 300.

Figure 4:
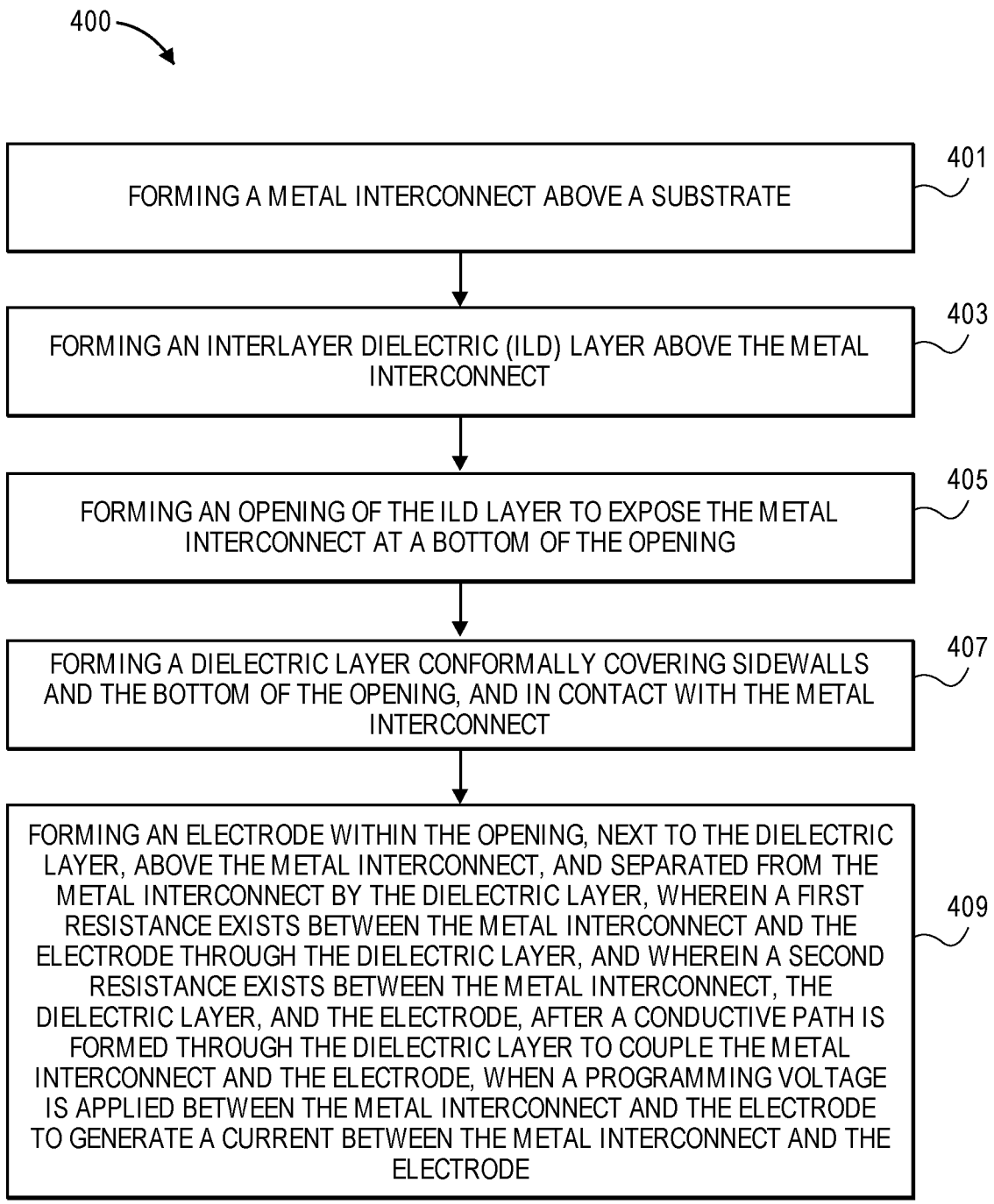
FIG. 4 schematically illustrates a process for forming an antifuse element including a dielectric layer between an electrode and a metal interconnect, in accordance with some embodiments.

FIG. 4 schematically illustrates a process 400 for forming an antifuse element including a dielectric layer between an electrode and a metal interconnect, in accordance with some embodiments. In embodiments, the process 400 may be applied to form the antifuse element 100 in FIG. 1, the antifuse element 200 in FIG. 2, or the antifuse element 310 in FIG. 3.

At block 401, the process 400 may include forming a metal interconnect above a substrate. For example, the process 400 may include forming the metal interconnect 103 above the substrate 101, as shown in FIG. 1.

At block 403, the process 400 may include forming an ILD layer above the metal interconnect. For example, the process 400 may include forming the ILD layer 109 above the metal interconnect 103, as shown in FIG. 1.

At block 405, the process 400 may include forming an opening of the ILD layer to expose the metal interconnect at a bottom of the opening. For example, the process 400 may include forming the opening 110 of the ILD layer 109 to expose the metal interconnect 103 at the bottom 115 of the opening 110.

At block 407, the process 400 may include forming a dielectric layer conformally covering sidewalls and the bottom of the opening, and in contact with the metal interconnect. For example, the process 400 may include forming the dielectric layer 121 conformally covering sidewalls 113 and the bottom 115 of the opening 110, and in contact with the metal interconnect 103.

At block 409, the process 400 may include forming an electrode within the opening, next to the dielectric layer, above the metal interconnect, and separated from the metal interconnect by the dielectric layer. A first resistance may exist between the metal interconnect and the electrode through the dielectric layer. When a programming voltage may be applied between the metal interconnect and the electrode to generate a current between the metal interconnect and the electrode, a conductive path within the dielectric layer may be formed between the metal interconnect and the electrode. A second resistance may exist between the metal interconnect and the electrode coupled by the conductive path through the dielectric layer. For example, the process 400 may include forming the electrode 123 within the opening 110, next to the dielectric layer 121, above the metal interconnect 103, and separated from the metal interconnect 103 by the dielectric layer 121. The first resistance 102 may exist between the metal interconnect 103 and the electrode 123 through the dielectric layer 121. When a programming voltage 111 may be applied between the metal interconnect 103 and the electrode 123 to generate the current 115 between the metal interconnect 103 and the electrode 123, the conductive path 125 within the dielectric layer 121 may be formed between the metal interconnect 103 and the electrode 123. The second resistance 104 may exist between the metal interconnect 103 and the electrode 123 coupled by the conductive path 125 through the dielectric layer 121.

In addition, the process 400 may include forming an OEL next to the dielectric layer, conforming covering the dielectric layer, and forming the electrode within the opening, next to the OEL, where the conductive path may be formed through the dielectric layer and the OEL to couple the metal interconnect and the electrode. Furthermore, the process 400 may include forming a source area within the substrate, a drain area within the substrate, a channel area between the source area and the drain area within the substrate, and a gate electrode above the channel area and above the substrate, wherein the gate electrode include a same material as the metal interconnect.

In addition, the process 400 may include additional operations to form other layers, e.g., ILD layers, or encapsulation layers, insulation layers, not shown. In some embodiments, the various blocks, e.g., the block 401, the block 403, the block 405, the block 407, and the block 409, may not be ordered as shown in FIG. 4. Various blocks of the process 400 may be performed in an order different from the one shown in FIG. 4.

Figure 5:
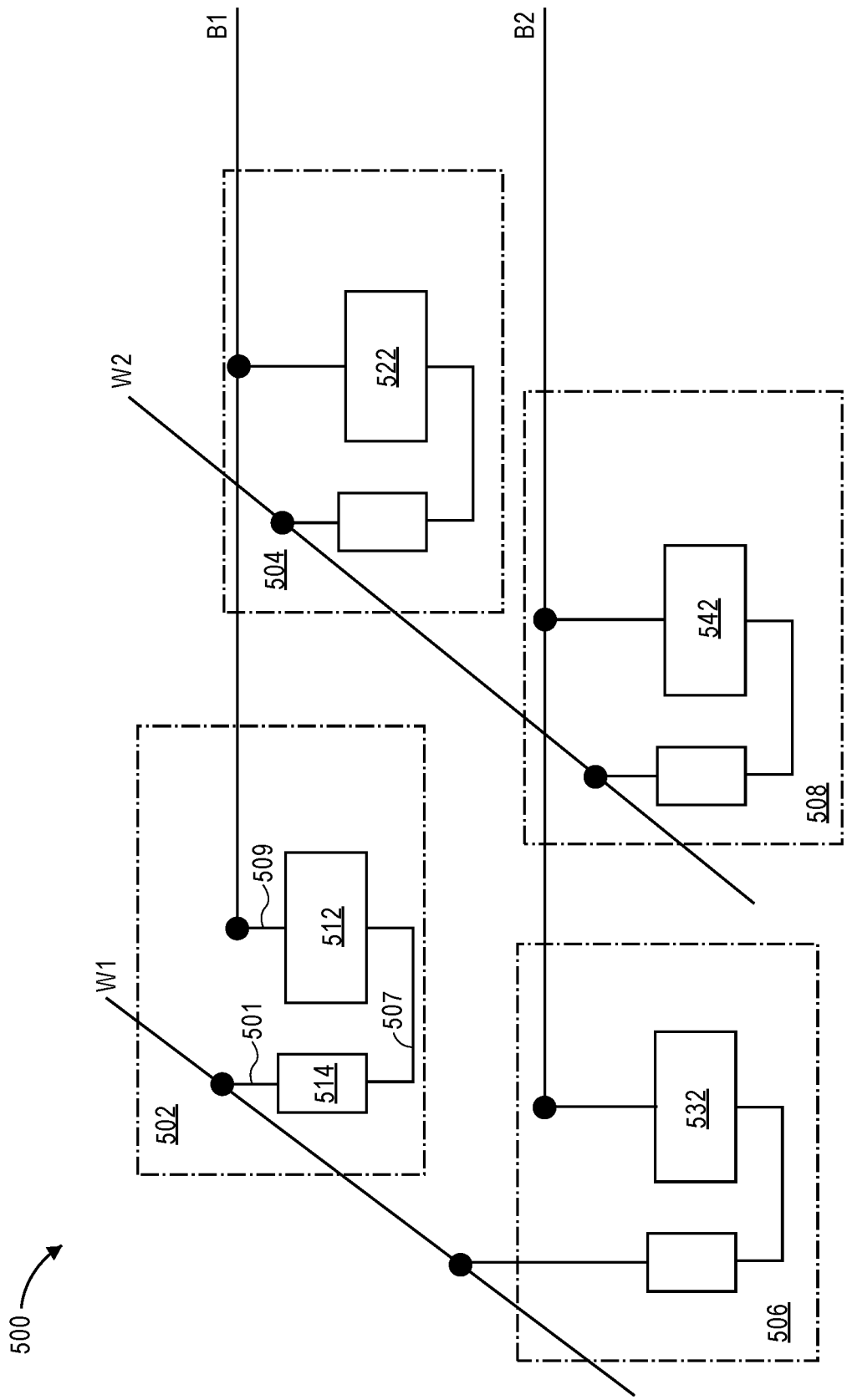
FIG. 5 schematically illustrates an antifuse memory array with multiple antifuse cells, where an antifuse cell includes an antifuse element with a dielectric layer between an electrode and a metal interconnect, in accordance with some embodiments.

FIG. 5 schematically illustrates an antifuse memory array 500 with multiple antifuse cells, e.g., an antifuse cell 502, an antifuse cell 504, an antifuse cell 506, and an antifuse cell 508, where an antifuse cell includes an antifuse element with a dielectric layer between an electrode and a metal interconnect, in accordance with some embodiments. For example, the antifuse cell 502 includes an antifuse element 512, the antifuse cell 504 includes an antifuse element 522, the antifuse cell 506 includes an antifuse element 532, and the antifuse cell 508 includes an antifuse element 542. In embodiments, the antifuse element 512, the antifuse element 522, the antifuse element 532, and the antifuse element 542 may be similar to the antifuse element 100, the antifuse element 200, the antifuse element 310, or an antifuse element formed following the process 400. In embodiments, the multiple antifuse cells may be arranged in a number of rows and columns coupled by bit lines, e.g., bit line B1 and bit line B2, and word lines, e.g., word line W1 and word line W2.

An antifuse cell, e.g., the antifuse cell 502, may be coupled in series with other antifuse cells, e.g., the antifuse cell 504, of the same row, and may be coupled in parallel with the antifuse cells of other rows, e.g., the antifuse cell 506 and the antifuse cell 508. The antifuse memory array 500 may include any suitable number of one or more antifuse cells. Although the antifuse memory array 500 is shown in FIG. 5 with two rows that each includes two antifuse cells coupled in series, other embodiments may include other numbers of rows and/or numbers of antifuse cells within a row. In some embodiments, the number of rows may be different from the number of columns in an antifuse memory array. Each row of the antifuse memory array may have a same number of antifuse cells. Additionally, or alternatively, different rows may have different numbers of antifuse cells.

In embodiments, multiple antifuse cells, such as the antifuse cell 502, the antifuse cell 504, the antifuse cell 506, and the antifuse cell 508, may have a similar configuration. For example, the antifuse cell 502 may include a selector 514 and the antifuse element 512. The antifuse cell 502 may be controlled through the selector 514 coupled to a bit line and a word line to read from the antifuse cell, write to the antifuse cell, and/or perform other memory operations. For example, the selector 514 may have an electrode 501 coupled to the word line W1, and the antifuse element 512 may have a contact 509 coupled to the bit line B1. In addition, the selector 514 and the antifuse element 512 may be coupled together by the electrode 507.

In embodiments, the antifuse element 512 may be individually controllable by the selector 514 to switch between a first state and a second state. When the word line W1 is active, the selector 514 may select the antifuse element 512. A signal from the word line W1 may pass through the selector 514, further through the antifuse element 512, and reaching the other electrode, which is the bit line B1.

In various embodiments, the antifuse elements, e.g., the antifuse element 512, the antifuse element 522, the antifuse element 532, and the antifuse element 542, included in the antifuse memory array 500 may be formed in BEOL processing. Accordingly, the antifuse memory array 500 may be formed in higher metal layers, e.g., metal layer three and/or metal layer four, of the integrated circuit above the active substrate region, and may not occupy the active substrate area that is occupied by conventional transistors or memory devices.

Figure 6:
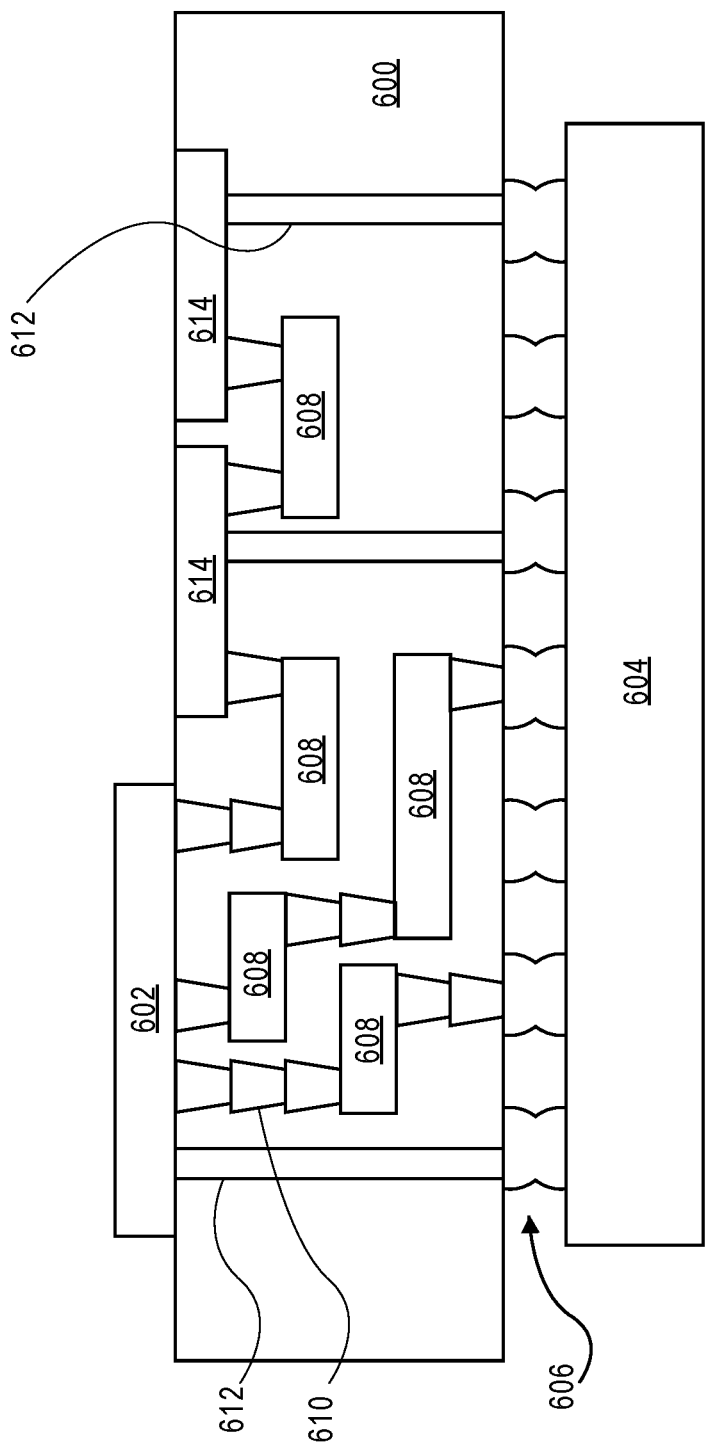
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 may be an intervening substrate used to bridge a first substrate 602 to a second substrate 604. The first substrate 602 may be, for instance, a substrate support for an antifuse element, e.g., the antifuse element 100 shown in FIG. 1, the antifuse element 200 shown in FIG. 2, or the antifuse element 310 shown in FIG. 3. The second substrate 604 may be, for instance, a memory module, a computer motherboard, or another integrated circuit die. For example, the second substrate 604 may be a memory module including the antifuse memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. In further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, antifuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
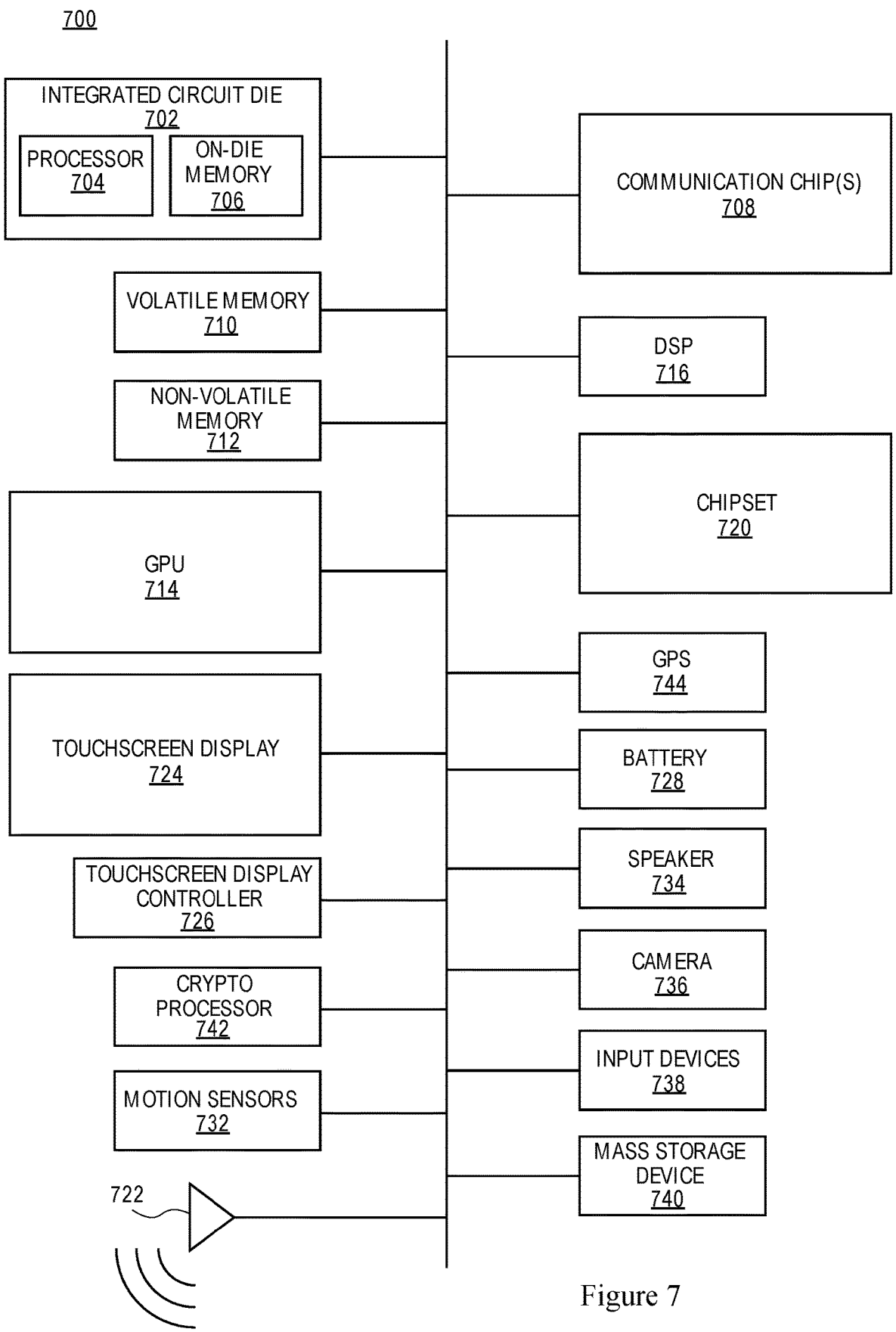
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the antifuse element 100 shown in FIG. 1, the antifuse element 200 shown in FIG. 2, the antifuse element 310 shown in FIG. 3, or the antifuse memory array 500 shown in FIG. 5.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as an antifuse memory array or antifuse elements, which are formed in accordance with implementations of the current disclosure, e.g., the antifuse element 100 shown in FIG. 1, the antifuse element 200 shown in FIG. 2, the antifuse element 310 shown in FIG. 3, an antifuse element formed according to the process 400 shown in FIG. 4, or the antifuse memory array 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an integrated circuit (IC), comprising: a metal interconnect above a substrate; an interlayer dielectric (ILD) layer above the metal interconnect, wherein the ILD layer includes an opening to expose the metal interconnect at a bottom of the opening; a dielectric layer conformally covering sidewalls and the bottom of the opening and in contact with the metal interconnect; and an electrode within the opening, above the metal interconnect, and separated from the metal interconnect by the dielectric layer, wherein a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

Example 2 may include the integrated circuit of example 1 and/or some other examples herein, wherein the electrode includes a via of an interconnect of the integrated circuit.

Example 3 may include the integrated circuit of example 1 and/or some other examples herein, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

Example 4 may include the integrated circuit of example 1 and/or some other examples herein, wherein the dielectric layer has a thickness in a range of about 1.5 nanometer (nm) to 4 nm.

Example 5 may include the integrated circuit of example 1 and/or some other examples herein, wherein the programming voltage is in a range of about 1.2 v to 4 v.

Example 6 may include the integrated circuit of example 1 and/or some other examples herein, wherein the current is less than or equal to about 10 milliamps (mA).

Example 7 may include the integrated circuit of example 1 and/or some other examples herein, wherein the first resistance is about 103 to 107 times larger than the second resistance.

Example 8 may include the integrated circuit of example 1 and/or some other examples herein, wherein the metal interconnect or the electrode includes titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 9 may include the integrated circuit of example 1 and/or some other examples herein, further comprising: an oxygen exchange layer (OEL) between the electrode and the metal interconnect, next to the dielectric layer, wherein the conductive path is formed through the dielectric layer, and the OEL to couple the metal interconnect and the electrode.

Example 10 may include the integrated circuit of example 9 and/or some other examples herein, wherein the OEL includes silicon (Si), carbon (C), titanium (Ti), zirconium (Zr), magnesium (Mg), or hafnium (Hf).

Example 11 may include the integrated circuit of example 9 and/or some other examples herein, wherein the OEL has a thickness less than 5.8 nm.

Example 12 may include the integrated circuit of example 9 and/or some other examples herein, wherein the dielectric layer is in a range of about 1.5 nm to 2 nm, the OEL is in a thickness of about 3 nm to 5 nm, and the programming voltage is in a range of 1.2 v to 2 v.

Example 13 may include the integrated circuit of example 1 and/or some other examples herein, further comprising: a transistor with a gate electrode, wherein the gate electrode include a same material as the metal interconnect.

Example 14 may include the integrated circuit of example 13 and/or some other examples herein, wherein the gate electrode and the metal interconnect are in different metal layers of the integrated circuit.

Example 15 may include a method for forming an integrated circuit, the method comprising: forming a metal interconnect above a substrate; forming an interlayer dielectric (ILD) layer above the metal interconnect; forming an opening of the ILD layer to expose the metal interconnect at a bottom of the opening; forming a dielectric layer conformally covering sidewalls and the bottom of the opening, and in contact with the metal interconnect; and forming an electrode within the opening, next to the dielectric layer, above the metal interconnect, and separated from the metal interconnect by the dielectric layer, wherein a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

Example 16 may include the method of example 15 and/or some other examples herein, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

Example 17 may include the method of example 15 and/or some other examples herein, wherein the first resistance is about 103 to 107 times larger than the second resistance.

Example 18 may include the method of example 15 and/or some other examples herein, further comprising: forming an oxygen exchange layer (OEL) next to the dielectric layer, conforming covering the dielectric layer, and forming the electrode within the opening, next to the OEL, wherein the conductive path is formed through the dielectric layer, and the OEL to couple the metal interconnect and the electrode.

Example 19 may include the method of example 18 and/or some other examples herein, wherein the OEL includes silicon (Si), carbon (C), titanium (Ti), zirconium (Zr), magnesium (Mg), or hafnium (Hf).

Example 20 may include the method of example 18 and/or some other examples herein, wherein the dielectric layer is in a range of about 1.5 nm to 2 nm, the OEL is in a thickness of about 3 nm to 5 nm, and the programming voltage is in a range of 1.2 v to 2 v.

Example 21 may include a computing device, comprising: a circuit board; and an antifuse memory array coupled to the circuit board, wherein the antifuse memory array includes a plurality of antifuse cells, an antifuse cell of the plurality of antifuse cells includes an antifuse element and a selector, and wherein the antifuse element includes: a metal interconnect above a substrate, wherein the metal interconnect is coupled to a bit line of the antifuse memory array; an interlayer dielectric (ILD) layer above the metal interconnect, wherein the ILD layer includes an opening to expose the metal interconnect at a bottom of the opening; a dielectric layer conformally covering sidewalls and the bottom of the opening and in contact with the metal interconnect; and an electrode within the opening, above the metal interconnect, and separated from the metal interconnect by the dielectric layer, wherein the electrode is coupled to a first contact of the selector, and the selector includes a second contact coupled to a word line of the antifuse memory array, a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

Example 22 may include the computing device of example 21 and/or some other examples herein, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

Example 23 may include the computing device of example 21 and/or some other examples herein, wherein antifuse element includes an oxygen exchange layer (OEL) between the electrode and the metal interconnect, next to the dielectric layer, wherein the conductive path is formed through the dielectric layer, and the OEL to couple the metal interconnect and the electrode.

Example 24 may include the computing device of example 21 and/or some other examples herein, wherein the antifuse element is without a void space when the conductive path is formed through the dielectric layer to couple the metal interconnect and the electrode, after the programming voltage is applied between the metal interconnect and the electrode to generate the current between the metal interconnect and the electrode.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
   a metal interconnect above a substrate;
   an interlayer dielectric (ILD) layer above the metal interconnect, wherein the ILD layer includes an opening to expose the metal interconnect at a bottom of the opening;
   a dielectric layer conformally covering sidewalls and the bottom of the opening and in contact with the metal interconnect, the dielectric layer having an uppermost surface; and
   an electrode within the opening, above the metal interconnect, and separated from the metal interconnect by the dielectric layer, wherein the electrode has an uppermost surface co-planar with the uppermost surface of the dielectric layer, wherein a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

2. The integrated circuit of claim 1, wherein the electrode includes a via of an interconnect of the integrated circuit.

3. The integrated circuit of claim 1, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

4. The integrated circuit of claim 1, wherein the dielectric layer has a thickness in a range of about 1.5 nanometer (nm) to 4 nm.

5. The integrated circuit of claim 1, wherein the programming voltage is in a range of about 1.2 v to 4 v.

6. The integrated circuit of claim 1, wherein the current is less than or equal to about 10 milliamps (mA).

7. The integrated circuit of claim 1, wherein the first resistance is about $10^3$ to $10^7$ times larger than the second resistance.

8. The integrated circuit of claim 1, wherein the metal interconnect or the electrode includes titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

9. The integrated circuit of claim 1, further comprising:
   an oxygen exchange layer (OEL) between the electrode and the metal interconnect, next to the dielectric layer, wherein the conductive path is formed through the dielectric layer, and the OEL to couple the metal interconnect and the electrode.

10. The integrated circuit of claim 9, wherein the OEL includes silicon (Si), carbon (C), titanium (Ti), zirconium (Zr), magnesium (Mg), or hafnium (Hf).

11. The integrated circuit of claim 9, wherein the OEL has a thickness less than 5.8 nm.

12. The integrated circuit of claim 9, wherein the dielectric layer is in a range of about 1.5 nm to 2 nm, the OEL is in a thickness of about 3 nm to 5 nm, and the programming voltage is in a range of 1.2 v to 2 v.

13. The integrated circuit of claim 1, further comprising:
   a transistor with a gate electrode, wherein the gate electrode include a same material as the metal interconnect.

14. The integrated circuit of claim 13, wherein the gate electrode and the metal interconnect are in different metal layers of the integrated circuit.

15. A method for forming an integrated circuit, the method comprising:
   forming a metal interconnect above a substrate;
   forming an interlayer dielectric (ILD) layer above the metal interconnect;
   forming an opening of the ILD layer to expose the metal interconnect at a bottom of the opening;
   forming a dielectric layer conformally covering sidewalls and the bottom of the opening, and in contact with the metal interconnect, the dielectric layer having an uppermost surface; and
   forming an electrode within the opening, next to the dielectric layer, above the metal interconnect, and separated from the metal interconnect by the dielectric layer, wherein the electrode has an uppermost surface co-planar with the uppermost surface of the dielectric layer, and wherein a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

16. The method of claim 15, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

17. The method of claim 15, wherein the first resistance is about 10.sup.3 to 10.sup.7 times larger than the second resistance.

18. The method of claim 15, further comprising:
forming an oxygen exchange layer (OEL) next to the dielectric layer, conforming covering the dielectric layer, and forming the electrode within the opening, next to the OEL, wherein the conductive path is formed through the dielectric layer, and the OEL to couple the metal interconnect and the electrode.

19. The method of claim 18, wherein the OEL includes silicon (Si), carbon (C), titanium (Ti), zirconium (Zr), magnesium (Mg), or hafnium (Hf).

20. The method of claim 18, wherein the dielectric layer is in a range of about 1.5 nm to 2 nm, the OEL is in a thickness of about 3 nm to 5 nm, and the programming voltage is in a range of 1.2 v to 2 v.

21. A computing device, comprising:
a circuit board; and
an antifuse memory array coupled to the circuit board, wherein the antifuse memory array includes a plurality of antifuse cells, an antifuse cell of the plurality of antifuse cells includes an antifuse element and a selector, and wherein the antifuse element includes: a metal interconnect above a substrate, wherein the metal interconnect is coupled to a bit line of the antifuse memory array;
an interlayer dielectric (ILD) layer above the metal interconnect, wherein the ILD layer includes an opening to expose the metal interconnect at a bottom of the opening;
a dielectric layer conformally covering sidewalls and the bottom of the opening and in contact with the metal interconnect, the dielectric layer having an uppermost surface; and
an electrode within the opening, above the metal interconnect, and separated from the metal interconnect by the dielectric layer, wherein the electrode has an uppermost surface co-planar with the uppermost surface of the dielectric layer, wherein the electrode is coupled to a first contact of the selector, and the selector includes a second contact coupled to a word line of the antifuse memory array, a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode.

22. The computing device of claim 21, wherein the dielectric layer includes silicon oxide (SiOx), silicon nitride (SiN), silicon oxynitride (SiON), silicon carbon nitride (SiCN), silicon carbide (SiC), carbon (C), titanium oxide (TiO), zirconium oxide (ZrOx), magnesium oxide (MgOx), or hafnium oxide (HfOx).

23. The computing device of claim 21, wherein the antifuse element includes an oxygen exchange layer (OEL) between the electrode and the metal interconnect, next to the dielectric layer, wherein the conductive path is formed through the dielectric layer, and the OEL to couple the metal interconnect and the electrode.

24. The computing device of claim 21, wherein the antifuse element is without a void space when the conductive path is formed through the dielectric layer to couple the metal interconnect and the electrode, after the programming voltage is applied between the metal interconnect and the electrode to generate the current between the metal interconnect and the electrode.

25. The computing device of claim 21, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

26. An integrated circuit (IC), comprising:
a metal interconnect above a substrate;
an interlayer dielectric (ILD) layer above the metal interconnect, wherein the ILD layer includes an opening to expose the metal interconnect at a bottom of the opening;
a dielectric layer conformally covering sidewalls and the bottom of the opening and in contact with the metal interconnect;
an electrode within the opening, above the metal interconnect, and separated from the metal interconnect by the dielectric layer, wherein a first resistance exists between the metal interconnect and the electrode through the dielectric layer, and wherein a second resistance exists between the metal interconnect and the electrode coupled by a conductive path through the dielectric layer, and the conductive path is formed through the dielectric layer to couple the metal interconnect and the electrode after a programming voltage is applied between the metal interconnect and the electrode to generate a current between the metal interconnect and the electrode; and
an oxygen exchange layer (OEL) between the electrode and the metal interconnect, next to the dielectric layer, wherein the conductive path is formed through the dielectric layer, and the OEL to couple the metal interconnect and the electrode.

\* \* \* \* \*